United States Patent [19]

Stecker et al.

[11] Patent Number: 5,774,014
[45] Date of Patent: Jun. 30, 1998

[54] INTEGRATED BUFFER CIRCUIT WHICH FUNCTIONS INDEPENDENTLY OF FLUCTUATIONS ON THE SUPPLY VOLTAGE

[75] Inventors: Johannes Stecker; Klaus Luther, both of Munich; Kurt Hoffmann, Taufkirchen; Oskar Kowarik, Neubiberg, all of Germany

[73] Assignee: Siemens Aktiengesellschaft, Munich, Germany

[21] Appl. No.: 627,568

[22] Filed: Apr. 4, 1996

[30] Foreign Application Priority Data

Apr. 5, 1995 [EP] European Pat. Off. .............. 95105126

[51] Int. Cl.$^6$ .................................................. G05F 1/10
[52] U.S. Cl. ........................................ 327/546; 323/315
[58] Field of Search ................................... 327/427, 437, 327/365, 374–377, 391, 538, 541, 543, 545, 546, 103; 323/315; 326/17, 23, 27, 33, 34

[56] References Cited

U.S. PATENT DOCUMENTS

| | | | |
|---|---|---|---|
| 4,723,108 | 2/1988 | Murphy et al. | 323/315 |
| 4,961,009 | 10/1990 | Baik | 327/103 |
| 5,258,663 | 11/1993 | Tamaki | 327/437 |
| 5,278,460 | 1/1994 | Casper | 327/546 |
| 5,434,534 | 7/1995 | Lucas | 327/541 |
| 5,455,527 | 10/1995 | Murphy et al. | 326/83 |
| 5,469,104 | 11/1995 | Smith et al. | 327/541 |
| 5,481,179 | 1/1996 | Keeth | 327/543 |
| 5,488,328 | 1/1996 | Ludwig et al. | 327/541 |
| 5,565,811 | 10/1996 | Park et al. | 327/541 |

OTHER PUBLICATIONS

Patent Abstracts of Japan, vol. 8, No. 53 (E–231) [1490] Mar. 9, 1984.

*Primary Examiner*—Timothy P. Callahan
*Assistant Examiner*—My-Trang Nu Ton
*Attorney, Agent, or Firm*—Herbert L. Lerner; Laurence A. Greenberg

[57] ABSTRACT

An integrated buffer circuit includes a first series circuit connected between a first supply potential and a second supply potential (ground). The first series circuit has a voltage-controlled first constant current source, a first field effect transistor having a gate forming an input of the buffer circuit, a circuit node between the first current source and the first field effect transistor forming an output of the buffer circuit, and a first control input for controlling the first current source with a reference potential having a constant potential difference relative to the first supply potential. A second series circuit is connected between the first supply potential and the second supply potential. The second series circuit has a first resistor, a second constant current source furnishing a current being independent of the first supply potential, and a circuit node between the first resistor and the second current source, establishing the reference potential and being connected to the first control input of the first current source.

5 Claims, 1 Drawing Sheet

INTEGRATED BUFFER CIRCUIT WHICH FUNCTIONS INDEPENDENTLY OF FLUCTUATIONS ON THE SUPPLY VOLTAGE

BACKGROUND OF THE INVENTION

FIELD OF THE INVENTION

The invention relates to an integrated buffer circuit including an input, an output, and a series circuit being located between a first supply potential and a second supply potential (ground) and having at least one voltage-controlled constant current source and a field effect transistor.

Buffer circuits are often needed in integrated circuits, for instance to adapt input signals of the circuits to signal properties (such as levels) needed internally in the circuit or to adapt output signals of circuits to further circuits following them. One known disadvantage of buffer circuits is their sensitivity to interference (such as noise) on the lines for the supply voltage. Their function is moreover highly dependent on voltage fluctuations that may occur in the supply voltage, especially if the buffer circuit is supposed to convert signals with a TTL level into those with CMOS levels (TTL levels: $\leq 0.8V$ and $\geq 2.4V$; CMOS levels: usually 0V and from 4V to 6V, typically 5V).

As the miniaturization of integrated circuits progresses, lower CMOS levels internally of the chip are increasingly used (such as 0V and 3.3V). It is often desirable to operate the integrated circuit selectively with a supply voltage for conventional, higher CMOS levels or with a lower supply voltage for lower CMOS levels.

An integrated buffer circuit which is known from published European patent Application 0 587 938 Al has a voltage-controlled constant current source that is largely independent of interference on the lines for the supply voltage. That constant current source is controlled through a control input by a reference potential which has a constant potential difference relative to one of the supply potentials. However, the constant current source is independent of the supply voltage only if the fluctuations in the supply voltage are relatively slight, since otherwise the reference potential no longer has that same potential difference from the supply potential. In the event of greater fluctuations in the supply voltage of several volts, or during operation of the circuit at different levels of supply voltages (for instance for higher CMOS levels in one case and lower CMOS levels in another), the output current of the buffer circuit furnished by the constant current source is no longer constant.

However, a constant output current of the buffer circuit is desirable in order to assure both a switching point and switching time of the buffer circuit that are independent of supply voltage, with the same capacitive load at the output.

SUMMARY OF THE INVENTION

It is accordingly an object of the invention to provide an integrated buffer circuit, which overcomes the hereinafore-mentioned disadvantages of the heretofore-known devices of this general type and which furnishes an output current that is independent of a supply potential.

With the foregoing and other objects in view there is provided, in accordance with the invention, an integrated buffer circuit, comprising a first series circuit connected between a first supply potential and a second supply potential (ground), the first series circuit including at least one voltage-controlled first constant current source, a first field effect transistor having a gate forming an input of the buffer circuit, a circuit node between the first constant current source and the first field effect transistor, the circuit node forming an output of the buffer circuit, and a first control input for controlling the first constant current source with a reference potential having a constant potential difference relative to the first supply potential; and a second series circuit connected between the first supply potential and the second supply potential, the second series circuit including at least one first resistor, a second constant current source furnishing a current being independent of the first supply potential, and a circuit node between the first resistor and the second constant current source, the circuit node establishing the reference potential and being connected to the first control input of the first constant current source.

The invention is based on the principle that a constant current through a linear resistor causes a constant voltage drop across the resistor. If a variable supply potential is applied to one terminal of the resistor, then a reference potential is obtained at the other terminal of the resistor that has a constant potential difference relative to the variable supply potential.

In accordance with another feature of the invention, the first constant current source has a second field effect transistor of a first channel type with a gate receiving the first control input.

In accordance with a further feature of the invention, the first channel type is a p-channel type, and the second field effect transistor of the first channel type has a source connected to the first supply potential.

In accordance with an added feature of the invention, there is provided a field effect transistor being connected as a diode and having the same electrical conductivity type as the second field effect transistor of the first channel type, the field effect transistor connected as a diode being connected between the first supply potential and the first resistor.

In accordance with an additional feature of the invention, there is provided a second control input for controlling the second constant current source, the second control input receiving a control potential having a constant potential difference relative to the second supply potential.

In accordance with yet another feature of the invention, the second constant current source has a second field effect transistor of a second channel type with a gate receiving the second control input.

In accordance with yet a further feature of the invention, there is provided a third field effect transistor of the first channel type and a third field effect transistor of the second channel type, being connected in series between the first supply potential and the second supply potential; a fourth field effect transistor of the first channel type, a fourth field effect transistor of the second channel type and a resistor element, being connected in series between the first supply potential and the second supply potential; the fourth field effect transistor of the first channel type having a gate and a drain being connected to one another; the third field effect transistor of the second channel type having a gate and a drain being connected to one another; the third field effect transistor of the first channel type having a gate connected to the gate of the fourth field effect transistor of the first channel type; and the fourth field effect transistor of the second channel type having a gate being connected to the gate of the third field effect transistor of the second channel type and to the second control input of the second constant current source.

In accordance with yet an added feature of the invention, there is provided a third field effect transistor of the first channel type and a third field effect transistor of the second channel type, being connected in series between the first supply potential and the second supply potential; a fourth field effect transistor of the first channel type, a fourth field effect transistor of the second channel type and a resistor element, being connected in series between the first supply potential and the second supply potential; the fourth field effect transistor of the first channel type having a gate and a drain being connected to one another; the third field effect transistor of the second channel type having a gate and a drain being connected to one another; and the third field effect transistor of the first channel type having a gate being connected to the gate of the fourth field effect transistor of the first channel type and to the second control input of the second constant current source.

In accordance with a concomitant feature of the invention, the first resistor is a transistor connected as a resistor.

Other features which are considered as characteristic for the invention are set forth in the appended claims.

Although the invention is illustrated and described herein as embodied in an integrated buffer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connect n with the accompanying drawings.

DESCRIPTION OF THE PREFERRED EMBODIMENTS

Figure 1:
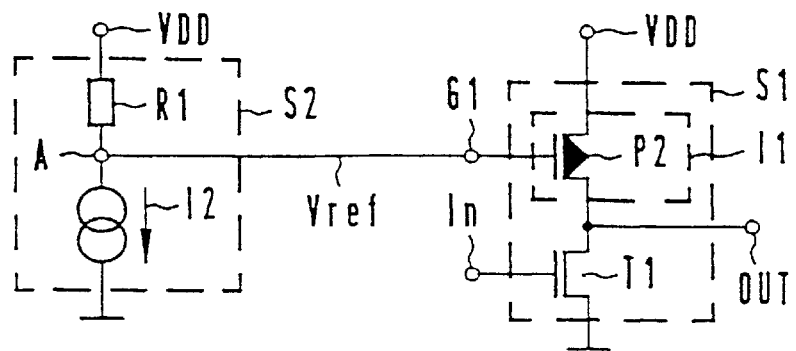
FIGS. 1 and 2 are schematic circuit diagrams showing embodiments of the invention.

Referring now to the figures of the drawings in detail and first, particularly, to FIG. 1 thereof, there is seen a first exemplary embodiment of an integrated buffer circuit of the invention, including a first series circuit S1 having a first field effect transistor T1 of the n-channel type and a second field effect transistor P2 of the p-channel type, functioning as a first constant current source I1. The first series circuit S1 is located between a first supply potential VDD and a second supply potential, ground, of the buffer circuit. In the case of the exemplary embodiments described below, it is assumed that the second supply potential, ground, is a constant reference potential and that the first supply potential VDD can be subject to fluctuations. Moreover, the buffer circuit can be operated with first supply potentials VDD of various levels.

Furthermore, the second field effect transistor p2 of the p-channel type is connected to the first supply potential VDD and the first field effect transistor T1 is connected to the second supply potential, ground. A gate of the first field effect transistor T1 forms an input In of the integrated buffer circuit. A circuit node between the first field effect transistor T1 and the second field effect transistor P2 of the p-channel type forms an output OUT of the buffer circuit.

A first control input G1 of the first constant current source I1 is formed by a gate of the second field effect transistor P2 of the p-channel type. A current which is furnished by the first constant current source I1 is intended to be independent of variations in the first supply potential VDD. It must therefore be assured that a gate-to-source voltage of the second field effect transistor P2 of the p-channel type, which is operated in saturation, will remain constant even in the event of variations in the first supply potential VDD. A reference potential Vref to be applied to the gate G1 of the second field effect transistor P2 of the p-channel type must accordingly have a constant potential difference from the first supply potential VDD that is connected to the source of the second field effect transistor P2 of the p-channel type, even if that supply potential varies.

That constant potential difference is attained by providing a second series circuit S2 between the first supply potential VDD and the second supply potential, ground. The second series circuit S2 has a first resistor R1 and a second constant current source I2. The first resistor R1 is connected to the first supply potential VDD, and the second constant current source I2 is connected to the second supply potential, ground. A circuit node A of the second series 25 circuit S2 is disposed between the first resistor R1 and the second constant current source I2. This circuit node A is connected to the control input G1 at the gate of the second field effect transistor P2 of the p-channel type. The desired reference potential Vref is established at the circuit node A.

By way of example, the first resistor R1 may be an ohmic resistor, or a transistor connected as a resistor.

The current generated by the second constant current source I2 through the second series circuit S2 is independent of changes in the first supply potential VDD. This constant current causes a constant voltage drop at the resistor R1. Thus the reference potential Vref always has a constant potential difference from the first supply potential VDD. As a consequence, the first constant current source I1 generates a current of constant intensity at all times, including during operation with a lower or a higher first supply potential VDD (such as 3.3 or 5 V).

Figure 2:
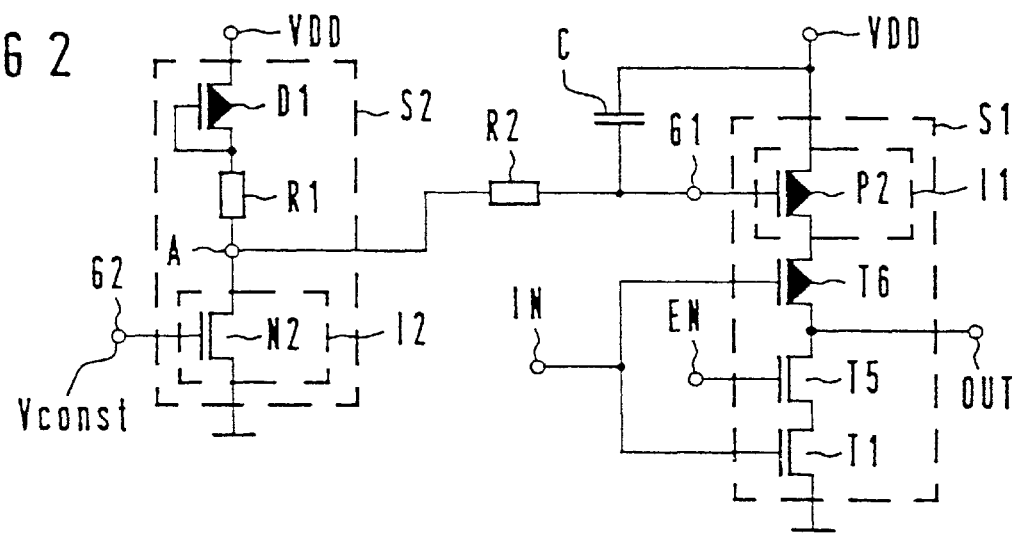

FIG. 2 shows a further exemplary embodiment of the invention, in which the buffer circuit has a CMOS inverter. The CMOS inverter contains the first field effect transistor T1 of the n-channel type, having a source which is connected to ground. A drain of the first field effect transistor T1 is connected through a fifth field effect transistor T5 of the n-channel type to a sixth field effect transistor T6 of the p-channel type. Gates of the first field effect transistor T1 and the sixth field effect transistor T6 are connected to one another and form the input IN of the buffer circuit. The output OUT of the buffer circuit is located at a circuit node of the first series circuit S1 between the fifth field effect transistor T5 and the sixth field effect transistor T6. A gate of the fifth field effect transistor T5, which in other embodiments of the invention may also be omitted, forms an enable input EN of the buffer circuit. It is also possible to provide additional enable transistors. The CMOS converter can be activated through the use of the enable input EN.

In the exemplary embodiment of FIG. 2, the first constant current source I1 is also formed by the second field effect transistor P2 of the p-channel type. The control input G1 at the gate of the second field effect transistor P2 is connected through a second resistor R2 to the circuit node A of the second series circuit S2. Moreover, the control input G1 is connected through a capacitor C to the first supply potential VDD. The capacitor C and the second resistor R2 serve to damp interference in the supply potentials, but they may also be omitted.

The second series circuit S2 has a field effect transistor of the p-channel type connected as a diode D1, in addition to the first resistor R1 and the second constant current source I2 connected thereto. The diode D1 is disposed between the first supply potential VDD and the first resistor R1. It is especially advantageous if the diode D1 has the same electrical properties as the second field effect transistor P2 of the p-channel type of the first constant current source I1. This leads to compensation for temperature factors and for deviations in production parameters.

In this exemplary embodiment, the second constant current source I2 is constructed by a second field effect transistor N2 of the n-channel type, having a drain which is connected to the circuit node A and a source which is connected to the second supply potential, ground. The second constant current source I2 is voltage-controlled and it has a control input G2, which is formed by a gate of the second field effect transistor N2 of the n-channel type. Through application of a control potential Vconst, which has a constant potential difference relative to the second supply potential, ground, a constant current which is independent of the first supply potential flows in the second series circuit S2.

Figure 3:
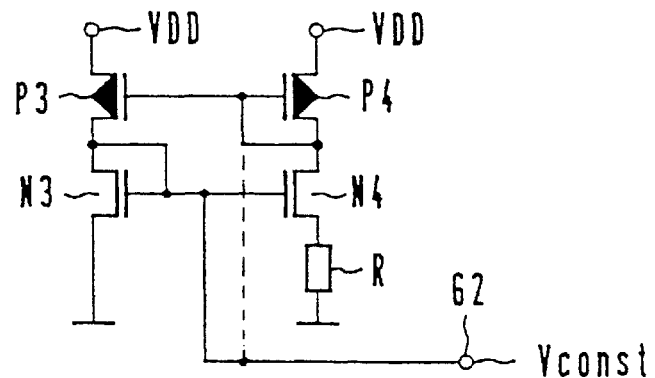
FIG. 3 is a schematic diagram of a circuit for generating a control potential for the exemplary embodiment of FIG. 2.

FIG. 3 shows a double current mirror, with the aid of which the constant control potential Vconst can be generated for controlling the second constant current source I2 of the exemplary embodiment shown in FIG. 2. The double current mirror has a third field effect transistor P3 of the p-channel type which is connected to the first supply potential VDD, and a third field effect transistor N3 of the n-channel type which is connected to the second supply potential, ground, in a series circuit. Moreover, the double current mirror has another series circuit with a fourth field effect transistor P4 of the p-channel type which is connected to the first supply potential VDD, a fourth field effect transistor N4 of the n-channel type which is connected to the transistor P4, and a resistor element R that is connected on one hand to the transistor N4 and on the other hand to the second supply potential, ground.

The gate and the drain of the third field effect transistor N3 of the n-channel type are connected to one another and the gate and the drain of the fourth field effect transistor P4 of the p-channel type are connected to one another. The gates of the third and fourth field effect transistors P3 and P4 of the p-channel type are connected to one another. Gates of the third and fourth field effect transistors N3 and N4 of the n-channel type are also connected to one another. These latter two gates are also connected to the second control input G2 of the second constant current source I2. The control potential Vconst which appears at the gates is independent of variations in the first supply potential VDD.

If the double current mirror is operated in the subthreshold current range (which is attainable by suitable dimensioning), then the reference potential Vref is independent of technologically dictated fluctuations in the resistance of the resistance element R and of the first resistor R1. It is also possible to pick up the control potential Vconst between the third and fourth field effect transistors P3 and P4 of the p-channel type, instead of between the third and fourth field effect transistors N3 and N4 of the n-channel type.

In order to generate the control potential Vconst, some other form of double current mirror, a single current mirror, or a bandgap reference may be used, for instance, instead of the double current mirror of FIG. 3.

Largely constant switching times are attainable with the integrated buffer circuit of the invention, even if the first supply potential VDD assumes values between 3 V and 7

We claim:
1. An integrated buffer circuit, comprising:
a first series circuit connected between a first supply potential and a second supply potential, said first series circuit including:
at least one voltage-controlled first constant current source,
a first field effect transistor having a gate forming an input of the buffer circuit,
a circuit node between said at least one voltage-controlled first constant current source and said first field effect transistor, said circuit node forming an output of the buffer circuit,
a first control input for controlling said at least one voltage-controlled first constant current source with a reference potential having a constant potential difference relative to the first supply potential, and
said at least one voltage-controlled first constant current source having a second field effect transistor of a first channel type with a gate receiving the first control input; and
a second series circuit connected between the first supply potential and the second supply potential, said second series circuit including:
at least one first resistor,
a voltage-controlled second constant current source furnishing a current being independent of the first supply potential,
a circuit node between said first resistor and said second constant current source, said circuit node establishing the reference potential and being connected to said first control input of said at least one voltage-controlled first constant current source,
a second control input for controlling said voltage-controlled second constant current source being a control voltage,
a voltage generating circuit for supplying said control voltage independently of said first supply potential, said control voltage having a constant potential difference relative to the second supply potential,
said second voltage-controlled constant current source having a second field effect transistor of a second channel type with a gate receiving said second control input, and
said voltage generating circuit including:
a third field effect transistor of the first channel type and a third field effect transistor of the second channel type, being connected in series between the first supply potential and the second supply potential,
a fourth field effect transistor of the first channel type, a fourth field effect transistor of the second channel type and a resistor element, being connected in series between the first supply potential and the second supply potential,
said fourth field effect transistor of the first channel type having a gate and a drain being connected to one another,
said third field effect transistor of the second channel type having a gate and a drain being connected to one another,
said third field effect transistor of the first channel type having a gate connected to the gate of said fourth field effect transistor of the first channel type, and
said fourth field effect transistor of the second channel type having a gate being connected to the gate of said third field effect transistor of the second channel type and to said second control input of said second constant current source.

2. The integrated buffer circuit according to claim 1, wherein the first channel type is a p-channel type, and said second field effect transistor of the first channel type of said at least one voltage-controlled constant current source has a source connected to the first supply potential.

3. The integrated buffer circuit according to claim 1, wherein said second series circuit includes a field effect transistor being connected as a diode and having the same electrical conductivity type as said second field effect transistor of the first channel type, said field effect transistor connected as a diode being connected between the first supply potential and said first resistor.

4. The integrated buffer circuit according to claim 1, wherein said first resistor is a transistor connected as a resistor.

5. An integrated buffer circuit, comprising:
　a first series circuit connected between a first supply potential and a second supply potential, said first series circuit including:
　　at least one voltage-controlled first constant current source;
　　a first field effect transistor having a gate forming an input of the buffer circuit;
　　a circuit node between said at least one voltage-controlled first constant current source and said first field effect transistor, said circuit node forming an output of the buffer circuit;
　　a first control input for controlling said at least one voltage-controlled first constant current source with a reference potential having a constant potential difference relative to the first supply potential;
　　said at least one voltage-controlled first constant current source having a second field effect transistor of a first channel type with a gate receiving the first control input; and
　a second series circuit connected between the first supply potential and the second supply potential, said second series circuit including:
　　at least one first resistor;
　　a voltage-controlled second constant current source furnishing a current being independent of the first supply potential;
　　a circuit node between said first resistor and said second voltage-controlled constant current source, said circuit node establishing the reference potential and being connected to said first control input of said first constant current source;
　　a second control input for controlling said second voltage-controlled constant current source being a control voltage, said control voltage having a constant potential difference relative to the second supply potential; and
　a voltage generating circuit for supplying said control voltage independently of said first supply potential, including:
　　a third field effect transistor of the first channel type and a third field effect transistor of the second channel type, being connected in series between the first supply potential and the second supply potential;
　　a fourth field effect transistor of the first channel type, a fourth field effect transistor of the second channel type and a resistor element, being connected in series between the first supply potential and the second supply potential;
　　said fourth field effect transistor of the first channel type having a gate and a drain being connected to one another;
　　said third field effect transistor of the second channel type having a gate and a drain being connected to one another; and
　　said third field effect transistor of the first channel type having a gate being connected to the gate of said fourth field effect transistor of the first channel type and to said second control input of said second constant current source.

* * * * *